(12) United States Patent
Segawa et al.

(10) Patent No.: US 6,652,998 B2
(45) Date of Patent: Nov. 25, 2003

(54) PRODUCING METHOD OF THIN FILM MAGNETIC TAPE AND THE THIN FILM MAGNETIC TAPE

(75) Inventors: Masaru Segawa, Yokohama (JP); Masahiko Sugiyama, Yokohama (JP)

(73) Assignee: JVC Victor Company of Japan, Ltd., Yokohama (JP)

( * ) Notice: Subject to any disclaimer, the term of this patent is extended or adjusted under 35 U.S.C. 154(b) by 20 days.

(21) Appl. No.: 09/885,313

(22) Filed: Jun. 20, 2001

(65) Prior Publication Data
US 2002/0015865 A1 Feb. 7, 2002

(30) Foreign Application Priority Data
Jun. 26, 2000 (JP) ........................................ 2000-191287

(51) Int. Cl.[7] ............................... G11B 5/66; G11B 5/70
(52) U.S. Cl. ................................ 428/694 TS; 428/900; 428/332
(58) Field of Search ............................ 428/694 TS, 900, 428/332

(56) References Cited

U.S. PATENT DOCUMENTS 4,950,548 A * 8/1990 Furusawa et al. ........... 428/611
5,453,886 A * 9/1995 Kobayashi et al. .......... 360/46

* cited by examiner

Primary Examiner—Holly Rickman
(74) Attorney, Agent, or Firm—Anderson Kill & Olick P.C.; Eugene Lieberstein; Michael N. Meller (57) ABSTRACT

In a first forming process, by injecting a predetermined amount of oxygen gas, magnetic metal vapor 7a is deposited as a nonmagnetic underlayer on a base film F wound on one film winding roll 3B while advancing the base film F in a reverse direction (second direction) toward another film winding roll 3A along a cooling can roll 5 from a minimum incidence angle side to a maximum incidence angle side of an incidence angle controlling mask 9. In a second forming process, by injecting a extremely smaller amount of oxygen gas than in the first forming process, magnetic metal vapor 7a is deposited as a magnetic layer over the nonmagnetic underlayer while advancing the base film deposited with the nonmagnetic underlayer wound on the other film winding roll 3A in a forward direction (first direction) toward the film winding roll 3B along the cooling can roll 5 from the maximum incidence angle side to the minimum incidence angle side of the incidence angle controlling mask 9.

2 Claims, 4 Drawing Sheets

PRODUCING METHOD OF THIN FILM MAGNETIC TAPE AND THE THIN FILM MAGNETIC TAPE

BACKGROUND OF THE INVENTION

1. Field of the Invention

The present invention relates to a producing method of a thin film magnetic tape and the thin film magnetic tape produced by applying an oblique evaporation process.

2. Description of the Related Art

Currently magnetic tapes applied to digital video recorders and audio tape recorders, especially, thin film magnetic tapes produced by applying an oblique evaporation process, are gaining attention in order to accomplish high density and reduced thickness of the tapes.

Figure 5:
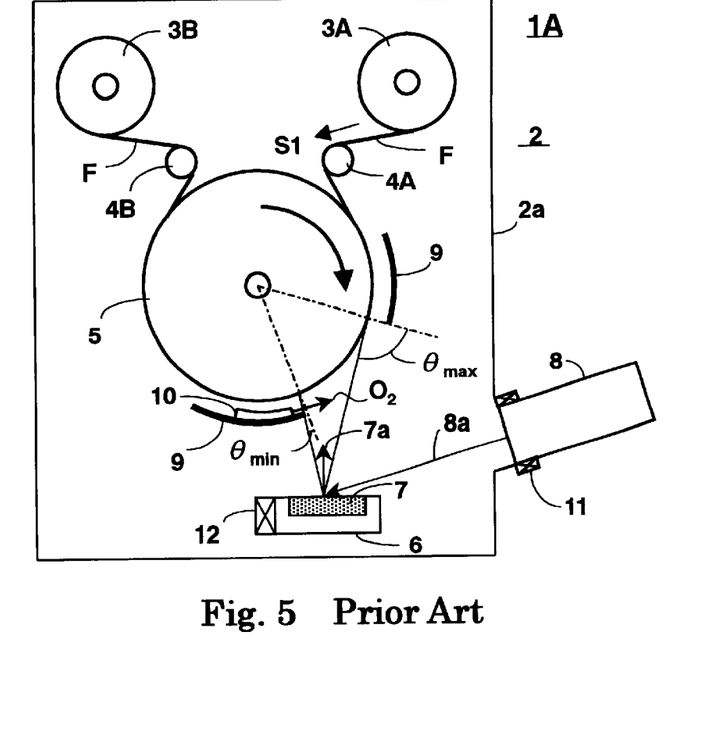
FIG. 5 is a plan view of a thin film magnetic tape producing apparatus of the prior art, which applies the oblique evaporation process.
Figure 6:
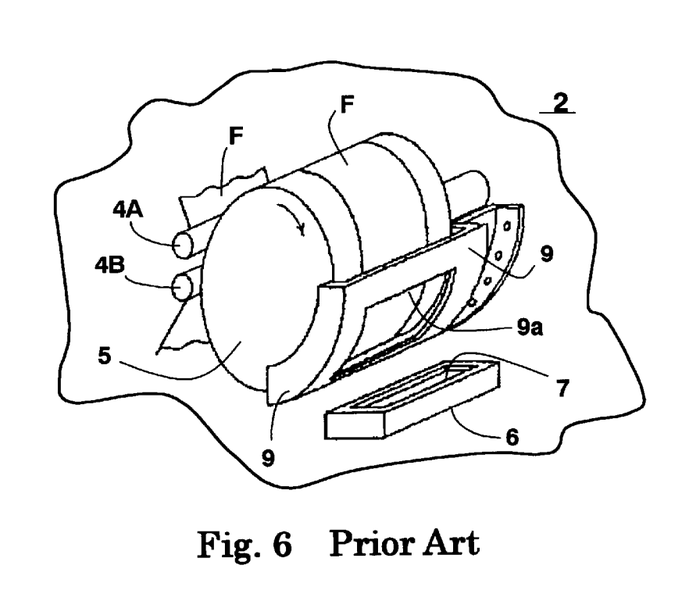
FIG. 6 is a perspective view of the thin film magnetic tape producing apparatus of FIG. 5, with parts broken away and in section, showing proximity of a cooling can roll.

FIG. 5 is a plan view of a thin film magnetic tape producing apparatus of the prior art, which applies the oblique evaporation process. FIG. 6 is a perspective view of the thin film magnetic tape producing apparatus of FIG. 5, with parts broken away and in section, showing proximity of a cooling can roll.

A magnetic layer of the above mentioned thin film magnetic tape is generally formed in a thin film by the oblique evaporation process. As shown in FIG. 5, the thin film magnetic tape producing apparatus 1A of the prior art, which applies the oblique evaporation process maintains a vacuum condition inside a vacuum chamber 2 by a vacuum pump (not shown). Inside the vacuum chamber 2, there provided a set of film winding rolls 3A and 3B, a set of tape guide rolls 4A and 4B, and a cooling can roll 5 being rotatable freely. During ordinarily forming a film on a base film F, the base film F wound on the film winding roll (hereinafter referred to a supply roll) 3A runs through the tape guide roll 4A, the cooling can roll 5, and the tape guide roll 4B in a forward direction shown by an arrow S1 to the film winding roll (hereinafter referred to a take-up roll) 3B.

The base film F is made by a PET (polyethylene terephthalate) film having a thickness of approximately 6.4 μm as a substrate for the thin film magnetic tape. A cooling apparatus (not shown) is installed inside the cooling can roll 5 so as to control deformation of the base film F due to increased temperature during a evaporation process.

A crucible 6, which is made from MgO (Magnesia) and formed in a box shape, is installed at a lower right hand corner from the cooling can roll 5 inside the vacuum chamber 2. A magnetic metal 7 such as Co is contained inside the crucible 6.

A piercing electron gun 8, which is an evaporation heat source to melt and evaporate the magnetic metal 7, is mounted on a right wall 2a of the vacuum chamber 2 with pointing at the crucible 6 located diagonally downward. The piercing electron gun 8 emits an electron beam 8a towards the magnetic metal 7 inside the crucible 6. The electron beam 8a melts the magnetic metal 7 and evaporates so as to coat a surface of the base film F, which is moving along the cooling can roll 5.

It is necessary to cover both edges of the base film F so as to prevent a magnetic metal vapor 7a, which evaporated from the crucible 6, from evaporating on the cooling can roll 5 while the base film F is running. Further, it is also necessary to control an incidence angle of evaporation of the magnetic metal vapor 7a such as evaporated Co (generally called oblique evaporation) with respect to a surface of the base film F due to the requirements for electromagnetic transducing characteristics when producing a thin film magnetic tape. In order to prevent deposits in inappropriate areas, an incidence angle controlling mask 9 is installed between the cooling can roll 5 and the crucible 6 as shown in FIG. 6.

A width of the base film F is narrower than a width of the cooling can roll 5 in this situation shown in FIG. 6. In order to prevent the magnetic metal vapor 7a from evaporating on or invading into the cooling can-roll 5 at proximity of both edges of the base film F, the incidence angle controlling mask 9 covers an area between an edge of the cooling can roll 5 and a few centimeter inwards an edge of the base film F. An opening 9a of the incidence angle controlling mask 9 is extremely small in order to control an incidence angle of the magnetic metal vapor 7a such as evaporated Co to the surface of the base film F and a growth angle of particles growing on the base film F.

Referring back to FIG. 5, an evaporation incidence angle of the above mentioned opening 9a of the incidence angle controlling mask 9 is an incidence angle of evaporating the magnetic metal vapor 7a such as evaporated Co on the base film F with respect to a line normal to the surface of the base film F being wraparound the cooling can roll 5. The evaporation incidence angle is set within a range of angle from a maximum incidence angle θ max to a minimum incidence angle θ min.

An oxygen gas injection pipe 10 is attached on an inner surface of the incidence angle controlling mask 9 with facing toward the cooling can roll 5 in a direction to the minimum incidence angle θ min side. Oxygen gas $O_2$ blows off through several holes provided on the oxygen gas injection pipe 10 towards the magnetic metal vapor 7a evaporated from the crucible 6.

The electron beam 8a emitted from the piercing electron gun 8 is controlled by a deflection magnet 11, which impresses a deflection magnetic field onto a trajectory of the electron beam 8a, and another deflection magnet 12, which is installed near the crucible 6. By scanning the electron beam 8a in the longitudinal direction of the crucible 6, the magnetic metal vapor 7a such as evaporated Co is thinly laminated on the surface of the base film F as a Co—CoO magnetic film in a lateral direction of the base film F. By laminating the Co—CoO Magnetic film on the base film F continuously in the longitudinal direction of the base film F, a long enough thin film magnetic tape is wound on the take-up roll 3B.

In a case of producing a thin film magnetic tape as mentioned above, a size of the opening 9a of the incidence angle controlling mask 9 is strictly limited. An efficiency of actual usage of the magnetic metal vapor 7a such as Co evaporated from the crucible 6 is only about 10 to 15% while almost all of the magnetic metal vapor 7a became unnecessary evaporation. In order to improve a usage efficiency of the magnetic metal vapor 7a by increasing a size of the opening 9a of the incidence angle controlling mask 9 even slightly, it is necessary to further improve magnetostatic characteristics.

With emergence of magnetoresistive heads such as a GMR (giant magnetoresistive) head and an MR (magnetoresistive) head, there exists a certain tendency to install such a magnetoresistive head into a digital video tape recorder. Therefore, an urgency to drastically decrease layer thickness of a magnetic layer of a thin film magnetic tape exists in order to improve a SN ratio of the thin film magnetic tape. However, there is existed a problem such that magnetostatic characteristics of a thin film magnetic tape is deteriorated if layer thickness of a magnetic layer of the thin film magnetic tape is decreased in accordance with a current method.

An idea of placing a CoO nonmagnetic underlayer underneath a magnetic layer of a thin film magnetic tape is suggested. This method will be explained in a [Comparative Example 2] section. With a deposit of Co—CoO magnetic layer on a top of growth particles (columns) of an isolated CoO nonmagnetic underlayer and isolation of growth particles (columns) of a Co—CoO magnetic layer in accordance with the growth particles (columns) of CoO nonmagnetic underlayer, dimishing magnetic interaction among Co—CoO magnetic layer particles prevents degradation of magnetostatic characteristics associated with an extremely thin Co—CoO magnetic layer.

When placing a nonmagnetic underlayer underneath a magnetic layer of a thin film magnetic tape, further isolation of a magnetic layer effectively reduces magnetic interaction among magnetic layer particles. Such a method to favorably deposit a nonmagnetic underlayer for this purpose, however, had not yet been discovered.

SUMMARY OF THE INVENTION

Accordingly, in consideration of the above-mentioned problems of the prior art, an object of the present invention is to provide a producing method of a thin film magnetic tape and the thin film magnetic tape, which exhibits excellent magnetostatic characteristics.

According to an aspect of the present invention, there provided a producing method of a thin film magnetic tape by using a producing apparatus provided with a vacuum chamber comprising: a pair of film winding rolls rotatable in a first and second directions being opposite to each other for winding a base film; a cooling can roll rotatable in the first and second directions for cooling the base film while forming; a crucible containing a magnetic metal being installed under the cooling can roll; a heat source for evaporating the magnetic metal; an incidence angle controlling mask installed between the cooling can roll and crucible for controlling a maximum and a minimum incidence angles of the magnetic metal vapor with respect to a normal line of the base film; and an oxygen gas injection device for injecting oxygen gas toward the magnetic metal vapor, wherein the base film is formed in a regular forming process by advancing the base film wound on one film winding roll of the pair of film winding rolls in the first direction toward another film winding roll along the cooling can roll, the producing method comprising steps of: a first forming process for depositing the magnetic metal vapor on the base film as a nonmagnetic underlayer by injecting a predetermined injection amount of the oxygen gas while advancing the base film wound on the other film winding roll in the second direction toward the film winding roll along the cooling can roll from the minimum incidence angle side to the maximum incidence angle side of the incidence angle controlling mask; and a second forming process for depositing the magnetic metal vapor over the nonmagnetic underlayer as a magnetic layer by injecting the oxygen gas in a smaller injection amount than in the first forming process while advancing the base film wound on the film winding roll in the first direction toward the other film winding roll along the cooling can roll from the maximum incidence angle side to the minimum incidence angle side of the incidence angle controlling mask.

According to another aspect of the present invention, there provided a thin film magnetic tape comprising at least a nonmagnetic underlayer and a magnetic layer in sequence on top of a base film, wherein a growing direction of growth particles (columns) of the nonmagnetic underlayer being and another growing direction of other growth particles (columns) of the magnetic layer deposited on a surface of the nonmagnetic underlayer is an opposite direction with respect to each other in a plane perpendicularly intersecting the surface of the base film.

Other object and further features of the present invention will be apparent from the following detailed description when read in conjunction with the accompanying drawings.

DETAILED DESCRIPTION OF THE PREFERRED EMBODIMENTS

A general description common to a producing method and a thin film magnetic tape itself is detailed first before depicting a specific embodiment.

Figure 1A:
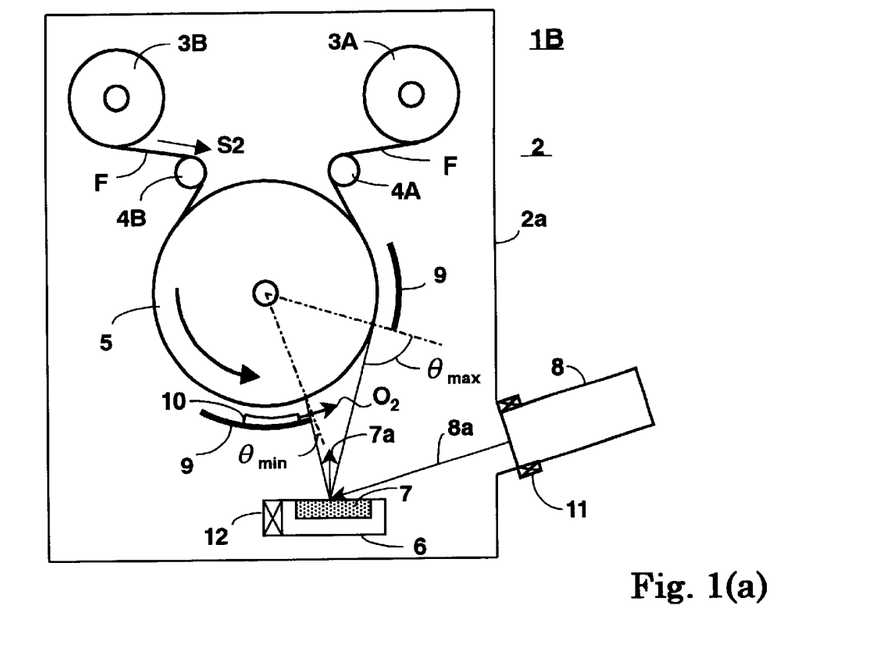
FIGS. 1(a) and 1(b) are plan views of a thin film magnetic tape producing apparatus to explain a production method of a thin film magnetic tape according to an embodiment of the present invention.
Figure 1B:
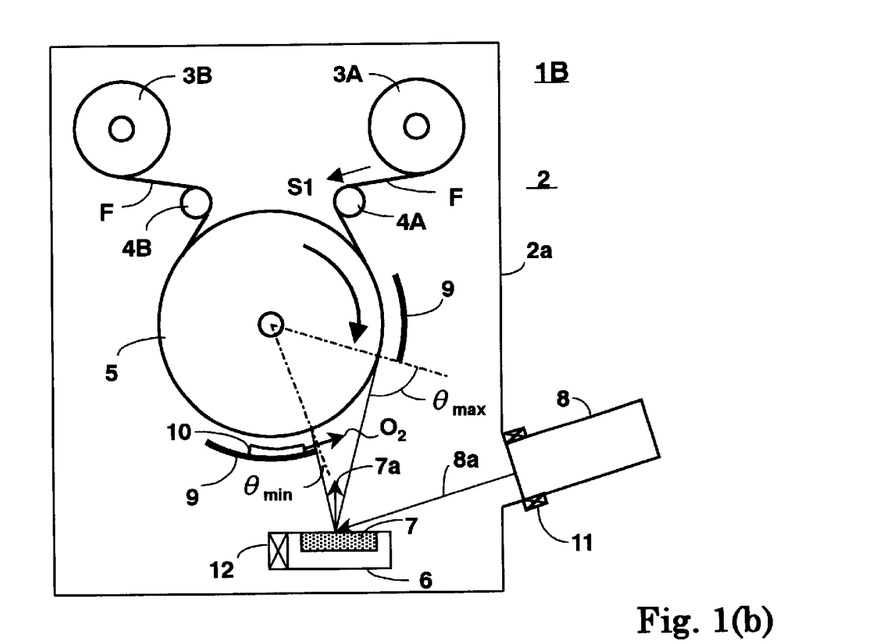

FIGS. 1(a) and 1(b) are plan views of a thin film magnetic tape producing apparatus to explain a production method of a thin film magnetic tape according to an embodiment of the present invention. FIG. 1(a) shows a first forming process for forming a nonmagnetic underlayer on a base film of a thin film magnetic tape. FIG. 1(b) shows a second forming process for forming a magnetic layer over the nonmagnetic underlayer formed on the thin film magnetic tape.

Figure 2:
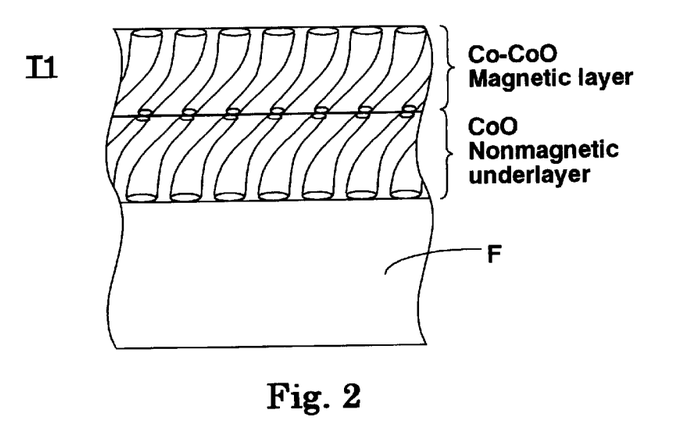
FIG. 2 is a model diagram showing a growing process of a particle growth of a nonmagnetic underlayer and a magnetic layer in the thin film magnetic tape according to the embodiment of the present invention.

FIG. 2 is a model diagram showing a growing process of a particle growth of a nonmagnetic underlayer and a magnetic layer in the thin film magnetic tape according to the embodiment of the present invention.

Figure 3A:
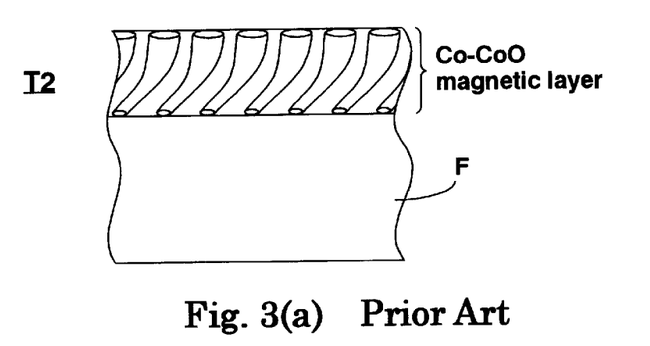
FIG. 3(a) is a model diagram showing a growing process of particle growth of a magnetic layer of a thin film magnetic tape according to a comparative example 1 of the prior art.
Figure 3B:
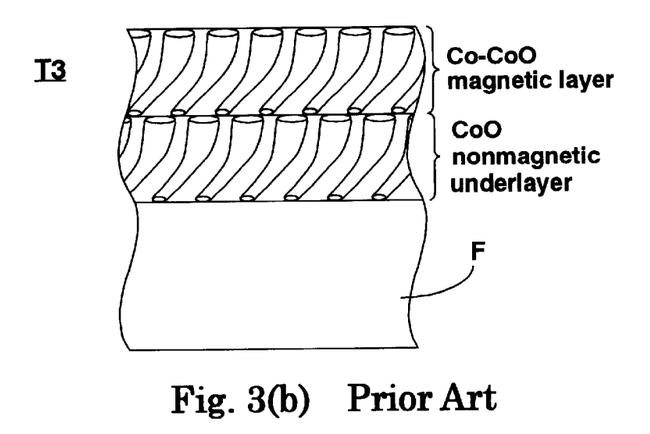
FIG. 3(b) is another model diagram showing a growing process of particle growth of a magnetic layer and a nonmagnetic underlayer of a thin film magnetic tape according to a comparative example 2 of the prior art.

FIG. 3(a) is a model diagram showing a growing process of particle growth of a magnetic layer of a thin film magnetic tape according to a comparative example 1 of the prior art. FIG. 3(b) is another model diagram showing a growing process of particle growth of a magnetic layer and a nonmagnetic underlayer of a thin film magnetic tape according to a comparative example 2 of the prior art.

Figure 4A:
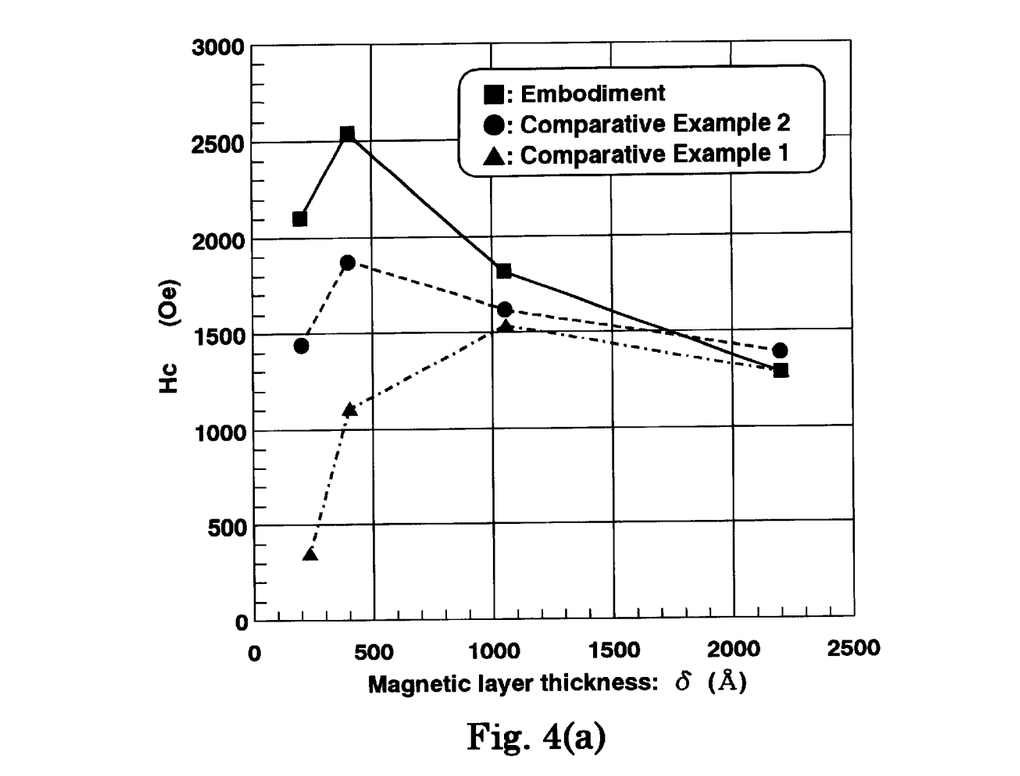
FIGS. 4(a) and 4(b) are comparison graphs showing magnetostatic characteristics of thin film magnetic tapes according to the embodiment of the present invention and the comparative examples 1 and 2 of the prior art.
Figure 4B:
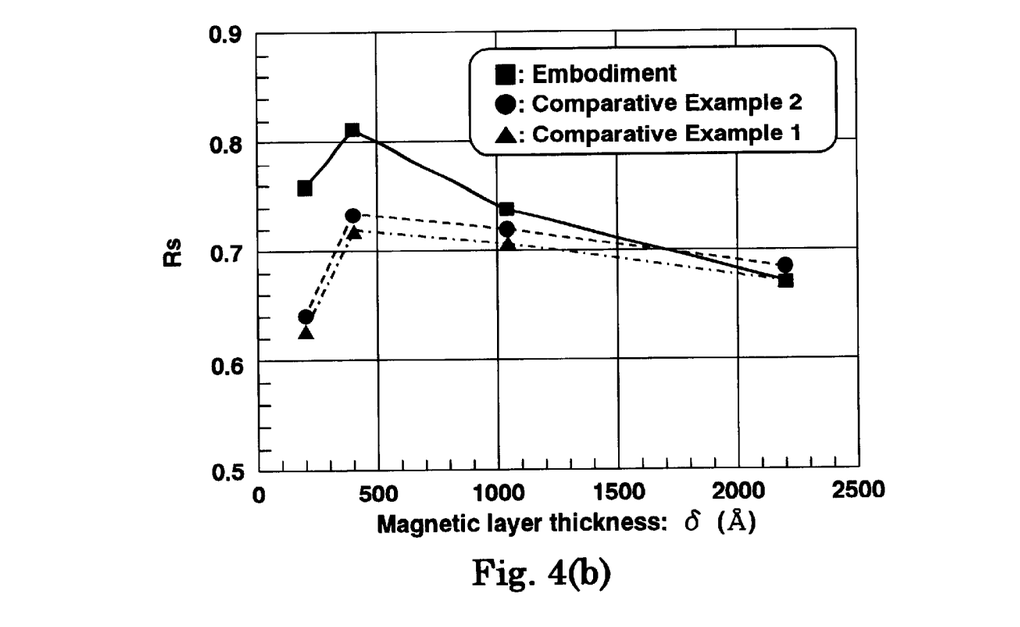

FIGS. 4(a) and 4(b) are comparison graphs showing magnetostatic characteristics of thin film magnetic tapes according to the embodiment of the present invention and the comparative examples 1 and 2 of the prior art. FIG. 4(a) exhibits a coercive force Hc of a magnetic layer of a thin film magnetic tape with respect to a layer thickness δ of the magnetic layer. FIG. 4(b) exhibits a squareness ratio Rs of a magnetic layer of a thin film magnetic tape with respect to a layer thickness δ of the magnetic layer.

A structure and a constitution of a thin film magnetic tape producing apparatus of the present invention shown in FIGS. 1(a) and 1(b) is basically a same as that of the prior art shown in FIG. 5. Therefore, explanation of a same operation and constitution of the thin film magnetic tape producing apparatus as the prior art are omitted.

A producing method of a thin film magnetic tape according to the present invention is composed of the first forming process, wherein a nonmagnetic underlayer is deposited on a base film of a thin film magnetic tape by applying an oblique evaporation process in a thin film magnetic tape producing apparatus 1B as shown in FIG. 1(a), and a second forming process, wherein a magnetic layer is further deposited on the nonmagnetic underlayer deposited on the base film by applying the oblique evaporation process in the thin film magnetic tape producing apparatus 1B as shown in FIG. 1(b). During the first forming process, a base film F runs in a reverse direction (second direction) shown by an arrow S2 in FIG. 1(a) with respect to the forward direction (first direction) of the regular forming process of the prior art so as to deposit a nonmagnetic underlayer on the base film F. During the second forming process, the base film F runs in the forward direction (first direction) of the regular forming process as shown by an arrow S1 in FIG. 1(b) so as to deposit a magnetic layer on a top surface of the nonmagnetic underlayer deposited on the base film F. Accordingly, the thin film magnetic tape producing apparatus 1B of the present invention is different from the thin film magnetic tape producing apparatus 1A of the prior art in a base film advancing operation such that a set of film winding rolls 3A and 3B, a set of tape guide rolls 4A and 4B, and a cooling can roll 5 can rotate in either forward (first) or reverse (second) direction.

The following features are identical to those of the prior art. A crucible 6, with a magnetic metal 7 contained inside, is installed at a lower right hand corner from the cooling can roll 5. A piercing electron gun 8, which is an evaporation heat source to melt and evaporate the magnetic metal 7, is mounted on a right wall 2a of the vacuum chamber 2. An incidence angle controlling mask 9 is installed between the cooling can control 5 and the crucible 6 in order to control a maximum incidence angle θ max and a minimum incidence angle θ min of magnetic metal vapor 7a evaporated from the magnetic metal 7 towards the base film F. An oxygen gas injection pipe 10 is attached on an inner surface of the incidence angle controlling mask 9 with facing toward the cooling can roll 5.

Further, during the second forming process, the base film F wound on the film winding roll 3A (hereinafter referred to supply roll) runs through the tape guide roll 4A, the cooling can roll 5, and the tape guide roll 4B, in the direction of the arrow S1 to the film winding roll 3B (hereinafter referred to take-up roll). This film advancing direction is also identical to that of the prior art.

While forming a film on the base film F along the cooling can roll 5 with applying the oblique evaporation process by using the thin film magnetic tape producing apparatus shown in FIGS. 1 (a) and 1(b), deposition at the maximum incidence angle θ max side of the incidence angle controlling mask 9 generally results in a sparse evaporation condition for the magnetic metal vapor 7a due to an excessive self shading effect of a film growth particle. On the other hand, deposition at the minimum incidence angle θ min side of the incidence angle controlling mask 9 results in a dense evaporation condition for the magnetic metal vapor 7a due to a lesser self shading effect of a film growth particle.

In the first forming process of forming a nonmagnetic underlayer on an untracked base film F, the base film F wound on the take-up roll 3B runs in the arrow S2 direction toward the supply roll 3A along the cooling can roll 5 from the minimum incidence angle θmin to the maximum incidence angle θ max of the incidence angle controlling mask 9. Oxygen gas $O_2$ is injected through the oxygen gas injection pipe 10 towards the magnetic metal vapor 7a evaporated from the magnetic metal 7 inside the crucible 6, and then the magnetic metal vapor 7a is completely oxidized. The oxidized magnetic metal vapor 7a is deposited on a surface of the base film F as a nonmagnetic underlayer. The base film F formed with the nonmagnetic underlayer is taken up by the supply roll 3A.

The crucible 6 contains the magnetic metal 7 such as Co. In order to deposit Co vapor (magnetic metal vapor) 7a evaporated from the crucible 6 onto the base film F as a CoO nonmagnetic underlayer, it is necessary to confirm with a prior experiment whether or not the CoO nonmagnetic underlayer is nonmagnetic by setting an injection amount of the oxygen gas $O_2$ over a predetermined amount. Therefore, the predetermined amount of oxygen gas $O_2$ is previously determined by changing an injection amount of oxygen gas $O_2$ as much as a CoO underlayer is not magnetized by using a vibrating sample magnetometer (VSM).

By advancing the base film F in the reverse direction (second direction) to the forward direction (first direction) of the prior art during the first forming process, growth particles (columns) of a CoO nonmagnetic underlayer is deposited on the base film F with shifting its evaporation condition from the dense evaporation condition at the minimum incidence angle θ min side of the incidence angle controlling mask 9 to the sparse evaporation condition at the maximum incidence angle θ max side.

In the second forming process of forming a magnetic layer on the top of the nonmagnetic underlayer deposited on the base film F, the base film F once taken up by the supply roll 3A runs toward the take-up roll 3B in the forward direction shown by the arrow S1 in FIG. 1(b) along the cooling can roll 5 from the maximum incidence angle θ max side to the minimum incidence angle θ min side of the incidence angle controlling mask 9. Oxygen gas $O_2$ in an extremely less amount than in the first forming process is injected towards the magnetic metal vapor 7a, and then the magnetic metal vapor 7a is partially oxidized. The partially oxidized magnetic metal vapor 7a is deposited on a surface of the nonmagnetic underlayer as a magnetic layer.

A same magnetic metal 7 as in the first forming process, Co for example, is contained inside the crucible 6 during the second forming process. In order to deposit Co vapor 7a, as same as in the first forming process, over the nonmagnetic layer deposited on the base film F as a Co—CoO magnetic layer, it is confirmed with a prior experiment that a Co—CoO layer has magnetism by setting an injection amount of oxygen gas $O_2$ to be less than a half of the necessary amount in the first forming process. The base film F with magnetic layer deposited on the nonmagnetic underlayer is taken up by the take-up roll 3B.

By advancing the base film F in the forward direction or the forward direction (S1), growth particles (columns) of the Co—CoO magnetic layer deposits on the CoO nonmagnetic underlayer with shifting its evaporation condition from the sparse evaporation condition at the maximum incidence angle θ max side of the incidence angle controlling mask 9 to the dense evaporation condition at the minimum incidence angle θ min side of the incidence angle controlling mask 9

Accordingly, a growing direction of the growth particles (columns) of the CoO nonmagnetic underlayer deposited by advancing the base film F to the reverse direction (S2) and another growing direction of growth particles (columns) of the Co—CoO magnetic layer are approximately in a same plane and opposite with respect to each other.

The base film F with the Co—CoO magnetic layer deposited on the CoO nonmagnetic underlayer is taken out of the vacuum chamber 2, and a diamond like carbon (DLC) layer is coated over the Co—CoO magnetic layer as a protection layer. The DLC layer is coated with lubricant and a back coat layer is formed on a reverse side of the base film F. Finally, the base film F is cut in a predetermined width for a thin film magnetic tape.

Thin film magnetic tapes in accordance with the present invention and comparative examples 1 and 2 are produced by following specifications, and then each thin film magnetic tape is investigated.

With respect to the cooling can roll 5 in a cylindrical shape, its diameter and width is 300 mm and 260 mm respectively. A base film running along the cooling can roll 5 is made from PET (polyethylene terephthalate) having a thickness of 6.4 μm and a width of 200 mm. A depositing area of the base film F is 150 mm wide. The piercing electron gun 8 having a maximum output of 30 kW is used for a heat source to melt and evaporate a magnetic metal 7 of pure Co inside the crucible 6 made from MgO (magnesia). The incidence angle controlling mask 9 is made of stainless steel having a thickness of 4 to 7 mm and surrounds an outer circumference area of the depositing area on the base film F with water cooled. The maximum incidence angle θ max and the minimum incidence angle θ min of the incidence angle controlling mask 9 is set to approximately 90° and 45° respectively. A supplier (not shown) is installed to supply a predetermined amount of the magnetic metal 7 of pure Co repeatedly from an edge of the crucible 6. Further, the oxygen gas injection pipe 10 is made of a stainless tube having a diameter of ¼ inch and formed in a loop shape having one inlet for oxygen gas. The oxygen gas injection pipe 10 is provided with a plurality of microscopic gas thrusting pores having a diameter of 0.5 mm at 3 mm pitch for oxygen gas injection. The gas thrusting pores are aimed toward the magnetic metal vapor 7a and installed in parallel with respect to the lateral direction of the base film F.

[Embodiment]

In the first forming process, by injecting approximately 200 cm³ per minute at a temperature of 25° C. and an atmospheric pressure of 1013 hPa (hereinafter referred to ccm) of high-purity oxygen gas $O_2$ from the oxygen gas injection pipe 10 installed in the minimum incidence angle θ min side of the incidence angle controlling mask 9 while advancing the base film F in the reverse direction (S2) from the minimum incidence angle θ min side to the maximum incidence angle θ max side of the incidence angle controlling mask 9 opposite to the forward direction (S1), a CoO nonmagnetic underlayer or a reverse-run underlayer having a layer thickness of approximately 0.07 μm (700 angstrom) is deposited on the base film F. When an injection amount of high-purity oxygen gas is set to approximately 200 ccm, by using a vibrating sample magnetometer (VSM), it is confirmed with a prior experiment that the CoO nonmagnetic underlayer is not magnetized.

In the second forming process, by injecting 40 ccm of high-purity oxygen gas $O_2$, less amount than a half of the first forming process, from the oxygen gas injection pipe 10 while advancing the base film F in the forward direction (S1) from the maximum incidence angle θ max side to the minimum incidence angle θ min side of the incidence angle controlling mask 9, a Co—CoO magnetic layer is deposited over the reverse-run underlayer formed on the base film F.

Further, during the second forming process, by shifting a layer thickness of the Co—CoO magnetic layer from approximately 0.02 μm (200 angstrom) to approximately 0.2 μm (2000 angstrom) repeatedly several times, several samples having each layer thickness of the Co—CoO magnetic layer of a thin film magnetic tape T1 having a structural condition shown in FIG. 2 in accordance with the embodiment of the present invention are produced. The thickness of the Co—CoO magnetic layer is measured by using a surface level measurement meter of needle touch type (Talystep manufactured by Rank-Taylar-Hobson) after etching a part of the Co—CoO magnetic layer by diluted aqua fortis. A center of the deposit of the Co—CoO magnetic layer is determined to have a predetermined layer thickness.

With respect to each of the plurality of samples, a rest part not etched of each sample is measured for magnetostatic characteristics by using the VSM. More specifically, a coercive force Hc and a squareness ratio Rs with respect to the layer thickness of the magnetic layer are measured as shown in FIGS. 4(a) and 4(b) respectively. The results of measurement shown in FIGS. 4(a) and (b) will be described along with the embodiment and the comparative examples 1 and 2 together.

Furthermore, a transmission electron microscope (TEM) and a scanning electron microscope (SEM) is utilized for observing a surface and a cross section in the forward direction of the base film F formed with the magnetic layer having a thickness of 0.04 μm (400 angstrom).

As mentioned above, by advancing the base film F in the reverse running direction in the first forming process, growth particles (columns) of the CoO nonmagnetic underlayer is deposited on the base film F with shifting its evaporation condition from the dense evaporation condition at the minimum incidence angle θ min side of the incidence angle controlling mask 9 to the sparse evaporation condition at the maximum incidence angle θ max side. As exemplarily shown in FIG. 2, a growing direction of the growth particles (columns) of the CoO nonmagnetic underlayer is supposed to be curved from the normal line to the layer surface direction to a parallel direction with respect to the layer surface as it is away from the surface of the base film F. In addition, isolation of growth particles (columns) of the CoO nonmagnetic underlayer increases at a surface area since the growth particles (columns) of the CoO nonmagnetic underlayer at the surface area is in the sparse evaporation condition.

By advancing the base film F in the forward direction in the second forming process, the growth particles (columns) of the Co—CoO magnetic layer deposits on the CoO nonmagnetic underlayer with increased isolation with shifting its evaporation condition from the sparse evaporation condition at the maximum incidence angle θ max side of the incidence angle controlling mask 9 to the dense evaporation condition at the minimum incidence angle θ min side of the incidence angle controlling mask 9. Isolation of growth particles (columns) of the Co—CoO magnetic layer also increases and concurrently the growth particle becomes finer. Magnetic interactions among particles of the Co—CoO magnetic layer are effectively diminished and it becomes easier to orient an easy axis of magnetization of the Co—CoO magnetic layer in parallel direction with respect to the layer surface. Accordingly, the coercive force Hc and the squareness ratio Rs of the Co—CoO magnetic layer can be extremely improved.

[Comparative Example 1]

FIG. 3(a) is a model diagram showing a growing process of particle growth of a magnetic layer of a thin film magnetic tape T2 according to a comparative example 1 of the prior art.

By injecting 40 ccm of high-purity oxygen gas $O_2$ from the oxygen gas injection pipe 10 while advancing the base film F in the forward direction from the maximum incidence angle θ max side to the minimum incidence angle θ min side of the incidence angle controlling mask 9, a Co—CoO magnetic layer is deposited directly on the surface of the base film F. By shifting a layer thickness of the Co—CoO magnetic layer repeatedly several times, several samples having each layer thickness of the Co—CoO magnetic layer of the thin film magnetic tape T2 having a structural condition shown in FIG. 3(a) in accordance with the comparative example 1 of the prior art are produced. A coercive force Hc and a squareness ratio Rs with respect to the layer thickness of the magnetic layer are measured as shown in FIGS. 4(a) and 4(b) respectively.

Further, a transmission electron microscope (TEM) and a scanning electron microscope (SEM) is utilized for observing a top surface and a cross section in the forward direction of the base film F formed with the magnetic layer having a thickness of approximately 0.04 µm (400 angstrom).

As exemplarily shown in FIG. 3 (a), by advancing the base film F in the forward direction, growth particles (columns) of the Co—CoO magnetic layer is merely deposited directly on the base film F with shifting its evaporation condition from the sparse evaporation condition at the maximum incidence angle θ max side to the dense evaporation condition at the minimum incidence angle θ min side of the incidence angle controlling mask 9.

[Comparative Example 2]

FIG. 3(b) is another model diagram showing a growing process of particle growth of a magnetic layer and a nonmagnetic underlayer of a thin film magnetic tape T3 according to a comparative example 2 of the prior art.

By injecting 200 ccm of high-purity oxygen gas $O_2$ as same injection amount as the embodiment from the oxygen gas injection pipe 10 while advancing the base film F in the forward direction from the maximum incidence angle θ max side to the minimum incidence angle θ min side of the incidence angle controlling mask 9 as a first process of producing the thin film magnetic tape T3, a CoO nonmagnetic underlayer or a forward-run underlayer having a layer thickness of approximately 0.07 µm (700 angstrom) is deposited on the surface of the base film F.

In a second process of producing the thin film magnetic tape T3, by injecting 40 ccm of high-purity oxygen gas $O_2$, less amount than a half of the first process exactly the same manner as the embodiment, from the oxygen gas injection pipe 10 while advancing the base film F in the forward direction from the maximum incidence angle θ max side to the minimum incidence angle θ min side of the incidence angle controlling mask 9, a Co—CoO magnetic layer is deposited over the forward-run underlayer formed on the base film F. By shifting a layer thickness of the Co—CoO magnetic layer repeatedly several times, several samples having each layer thickness of the Co—CoO magnetic layer of the thin film magnetic tape T3 having a structural condition shown in FIG. 3(b) in accordance with the comparative example 2 of the prior art are produced. A coercive force Hc and a squareness ratio Rs with respect to the layer thickness of the magnetic layer are measured as shown in FIGS. 4(a) and 4(b) respectively.

Further, a transmission electron microscope (TEM) and a scanning electron microscope (SEM) is utilized for observing a top surface and a cross section in the forward direction of the base film F formed with the magnetic layer having a thickness of approximately 0.04 µm (400 angstrom).

As mentioned above, by advancing the base film F in the forward direction in the first process, growth particles (columns) of the CoO nonmagnetic underlayer is deposited on the base film F with shifting its evaporation condition from the sparse evaporation condition at the maximum incidence angle θ max side of the incidence angle controlling mask 9 to the dense evaporation condition at the minimum incidence angle θ min side. As exemplarily shown in FIG. 3(b), a growing direction of the growth particles (columns) of the CoO nonmagnetic underlayer is supposed to be curved from a parallel direction with respect to the layer surface to the normal line to the layer surface direction as it is away from the surface of the base film F. In addition, since the growth particles (columns) of the CoO nonmagnetic underlayer at the surface area is in the dense evaporation condition, there existed some isolation of growth particles (columns) of the CoO nonmagnetic underlayer. However, it is in a lower degree.

By advancing the base film F in the forward direction in the second process, growth particles (columns) of the Co—CoO magnetic layer is deposited on the less isolated CoO nonmagnetic underlayer with shifting its evaporation condition from the sparse evaporation condition at the maximum incidence angle θ max side of the incidence angle controlling mask 9 to the dense evaporation condition at the minimum incidence angle θ min side. Therefore, a degree of isolation for growth particles (columns) of the Co—CoO magnetic layer is also relatively small. Consequently, it is found that a coercive force Hc is improved, however, a squareness ratio Rs is not improved although a magnetic interaction among particles of the Co—CoO magnetic layer still exists.

Comparing the above-mentioned embodiment of the present invention with the comparative examples 1 and 2 results in FIGS. 4(a) and 4(b).

In a case of the embodiment of the present invention, that is, in a case of the thin film magnetic tape T1 having the reverse-run underlayer, the thinner a thickness δ of the magnetic layer becomes, the more the coercive force Hc is improved in comparison with the comparative examples 1 and 2 as shown in FIG. 4(a). Particularly, a more favorable value of Hc is achieved with thickness under 0.05 µm (500 angstrom). Further, the thinner a thickness δ of the magnetic layer becomes, the more the squareness ratio Rs is improved in comparison with the comparative examples 1 and 2 as shown in FIG. 4(b). A more favorable value of Rs is achieved with a thickness δ under 0.05 µm (500 angstrom).

In a case of the comparative example 1, that is, in a case of the thin film magnetic tape T2 having only the Co—CoO magnetic layer without a nonmagnetic underlayer, at a thickness δ of the magnetic layer below 0.05 µm (500 angstrom) the coercive force Hc is significantly degraded and the squareness ratio Rs is also degraded as shown in FIGS. 4(a) and 4(b).

In a case of the comparative example 2, that is, in a case of the thin film magnetic tape T3 having the forward-run underlayer, the coercive force Hc shows a serviceable value at a thickness δ of the magnetic layer of 0.05 μm (500 angstrom). However, the coercive force value significantly degrades with a thickness δ below 0.02 μm (200 angstrom) as shown in FIG. 4(a). The squareness ratio Rs shows similar tendencies as the comparative example 1 as shown in FIG. 4(b).

While the invention has been described above with reference to the specific embodiment thereof, it is apparent that many changes, modifications and variations in the arrangement of equipment and devices and in materials can be made without departing the invention concept disclosed herein. For example, metal oxide, metal nitride, or nonmagnetic metal used for forming a nonmagnetic underlayer of the present invention is such as cobalt oxide, cobalt nitride, iron oxide, iron nitride, nickel oxide, and nickel nitride, and an alloy containing at least one of them. Further, such elements as Mg, Zr, Mo, W, Ru, Ti, B, Si, Cu and Zn, and their oxide and nitride compounds can be used for forming a nonmagnetic underlayer of the present invention. With respect to a ferromagnetic metal used for forming a magnetic layer or a ferromagnetic metal thin film of the present invention, a metal such as cobalt, iron and nickel, and their oxide and nitride compound, or a ferromagnetic alloy containing at least one of them such as Co—X, Fe—X, CoFe—X, CoNi—X, FeNi—X and CoFeNiA—X can be used for forming a magnetic layer, wherein X is a single or a plurality of nonmagnetic elements. With respect to a thickness of a magnetic layer or a ferromagnetic metal thin film shall be not more than 0.1 μm, which is a limit of actualizing an effect of the present invention generally, more preferably it shall be not more than 0.05 μm. Furthermore, a nonmagnetic substrate in a tape shape such as a polymeric film of any material can be used for a base film.

According to an aspect of the present invention, there provided a producing method of a thin film magnetic tape and the thin film magnetic tape, which exhibits excellent magnetostatic characteristics. When some layers including at least a nonmagnetic underlayer and a magnetic layer are formed on a base film in sequence, the nonmagnetic underlayer is deposited on the base film in a first forming process while advancing the base film in a reverse direction from a minimum incidence angle side to a maximum incidence angle side of an incidence angle controlling mask. In a second forming process, a magnetic layer is formed over the nonmagnetic underlayer deposited on the base film while advancing the base film having the nonmagnetic underlayer in a forward direction from the maximum incidence angle side to the minimum incidence angle side of the incidence angle controlling mask. Consequently, magnetostatic characteristics, particularly, the coercive force Hc and the squareness ratio Rs are significantly improved in comparison with those of the prior art by decreasing a thickness of the magnetic layer. Accordingly, a thin film magnetic tape having an excellent magnetostatic characteristics coping with a further thinner magnetic layer demanded for a high-density recording and reproducing can be obtained. In addition thereto, a product cost of the thin film magnetic tape can be reduced significantly.

What is claimed is:

1. A thin film magnetic tape comprising at least a nonmagnetic underlayer and a magnetic layer in sequence on a surface of a base film, wherein a growing direction of growth particles (columns) of said nonmagnetic underlayer and another growing direction of other growth particles (columns) of said magnetic layer deposited on a surface of said nonmagnetic underlayer is an opposite direction with respect to each other in a plane perpendicularly intersecting the surface of said base film.

2. The thin film magnetic tape in accordance with claim 1, wherein thickness of said magnetic layer is kept under 1000 angstrom (100 nm), and preferably under 500 angstrom (50 nm).

* * * * *